United States Patent
Lee et al.

(10) Patent No.: US 7,877,873 B2
(45) Date of Patent: Feb. 1, 2011

(54) METHOD FOR FORMING A WIRE BONDING SUBSTRATE

(75) Inventors: Meng-Han Lee, Taoyuan County (TW); Hung-En Hsu, Taoyuan County (TW); Wei-Wen Lan, Taoyuan County (TW); Yun-Hsiang Pai, Taoyuan County (TW)

(73) Assignee: NAN YA PCB Corp., Taoyuan County (TW)

( * ) Notice: Subject to any disclaimer, the term of this patent is extended or adjusted under 35 U.S.C. 154(b) by 243 days.

(21) Appl. No.: 12/109,307

(22) Filed: Apr. 24, 2008

(65) Prior Publication Data

US 2009/0206487 A1 Aug. 20, 2009

(30) Foreign Application Priority Data

Feb. 14, 2008 (TW) .............................. 97105140 A

(51) Int. Cl.
*H01K 3/10* (2006.01)
(52) U.S. Cl. .............................. 29/852; 29/825; 29/830; 29/840
(58) Field of Classification Search .................. 29/825, 29/830, 846, 852
See application file for complete search history.

(56) References Cited

U.S. PATENT DOCUMENTS

| 7,592,706 | B2 * | 9/2009 | Hsu | 257/777 |
| 2006/0131176 | A1 * | 6/2006 | Hsu | 205/125 |
| 2007/0221404 | A1 * | 9/2007 | Das et al. | 174/264 |
| 2007/0289773 | A1 * | 12/2007 | Caletka et al. | 174/262 |
| 2008/0120835 | A1 * | 5/2008 | Caletka et al. | 29/852 |

* cited by examiner

*Primary Examiner*—C. J Arbes

(57) ABSTRACT

A method for forming a wire bonding substrate is disclosed. A substrate comprising a first surface and a second surface is provided. A through hole is formed in the substrate. A conductive layer is formed on the first surface and the second surface of the substrate and covers a sidewall of the through hole. The conductive layer on the first surface of the substrate is patterned to form at least a first conductive pad, and the conductive layer on the second surface of the substrate is patterned to form at least a second conductive pad. An insulating layer is formed on the first surface and the second surface of the substrate and covers the first conductive pad and the second conductive pad. The insulating layer is recessed until top surfaces of the first conductive pad and the second conductive pad are exposed. A first metal layer is electroplated on the first conductive pad by applying current from the second conductive pad to the first conductive pad through the conductive layer passing the through hole.

10 Claims, 6 Drawing Sheets

METHOD FOR FORMING A WIRE BONDING SUBSTRATE

BACKGROUND OF THE INVENTION

1. Field of the Invention

The invention relates to a printed circuit board and fabrication thereof, and more particularly relates to gold fingers of a printed circuit board and method for forming related products.

2. Description of the Related Art

Printed circuit boards (PCB) are currently in wide use in various electronic equipments. With progress of technology, wiring density of printed circuit boards is more and more condensed. It is important for printed circuit boards to improve wiring density and while not sacrificing process stability, reliability, low cost and yield.

In the process of fabricating gold fingers of a printed circuit board, a nickel and gold layer is required to be deposited on a wire pattern in the wire bonding substrate to provide stable electrical connection for the wire bonding substrate and chips.

Generally, prior art requires plating bus lines, extending from circuits to the periphery of the wire bonding substrate, for providing a conductive-line path when plating nickel and gold on the wire bonding substrate to form a nickel and gold layer on the area without covering a solder mask. However, the plated buses must use some area of the wire bonding substrate and affects wiring density of the substrate.

Further, as shown in FIG. 1, when the wiring density of the bonding substrate 108 is increased, the line pitch P of the gold fingers 102 is decreased. The effective bonding top width W and the bottom gap S of gold fingers 102 are main specifications of a wire bonding substrate 108. The bonding width W is required to large enough, and limited to a sufficient bottom gap S in a limited line pitch P. However, when fabricating a gold finger 102, the nickel and gold layer 106 covers the top and sidewall of the copper pad 104, and when thickness of the nickel and gold layer 106 increases, the line pitch P is decreased. Thus, shot or open, easily occurs and increase of the bonding width W is limited. Further, when the bottom gap S is too small, migration issues may occur.

BRIEF SUMMARY OF INVENTION

According to the previous above described issues, the invention provides a method for forming a wire bonding substrate. A substrate comprising a first surface and a second surface is provided. A through hole is formed in the substrate. A conductive layer is formed on the first surface and the second surface of the substrate and covers a sidewall of the through hole. The conductive layer on the first surface of the substrate is patterned to form at least a first conductive pad, and the conductive layer on the second surface of the substrate is patterned to form at least a second conductive pad. An insulating layer is formed on the first surface and the second surface of the substrate and covers the first conductive pad and the second conductive pad. The insulating layer is recessed until top surfaces of the first conductive pad and the second conductive pad are exposed. A first metal layer is electroplated on the first conductive pad by applying current from the second conductive pad to the first conductive pad through the conductive layer passing the through hole.

The invention provides a wire bonding substrate. A substrate comprises a first surface and a second surface, and the substrate comprises a through hole. At least a gold finger is disposed on the first surface of the substrate, wherein the gold finger comprises a first metal pad and a first metal layer on a top surface of the first metal pad, and a sidewall of the first metal pad is covered by an insulating layer. A second metal pad is disposed on the second surface of the substrate. A conductive layer passes the through hole, and electrically connects the gold finger and the second metal pad.

BRIEF DESCRIPTION OF DRAWINGS

The invention can be more fully understood by reading the subsequent detailed description and examples with references made to the accompanying drawings, wherein.

DETAILED DESCRIPTION OF INVENTION

Figure 1:
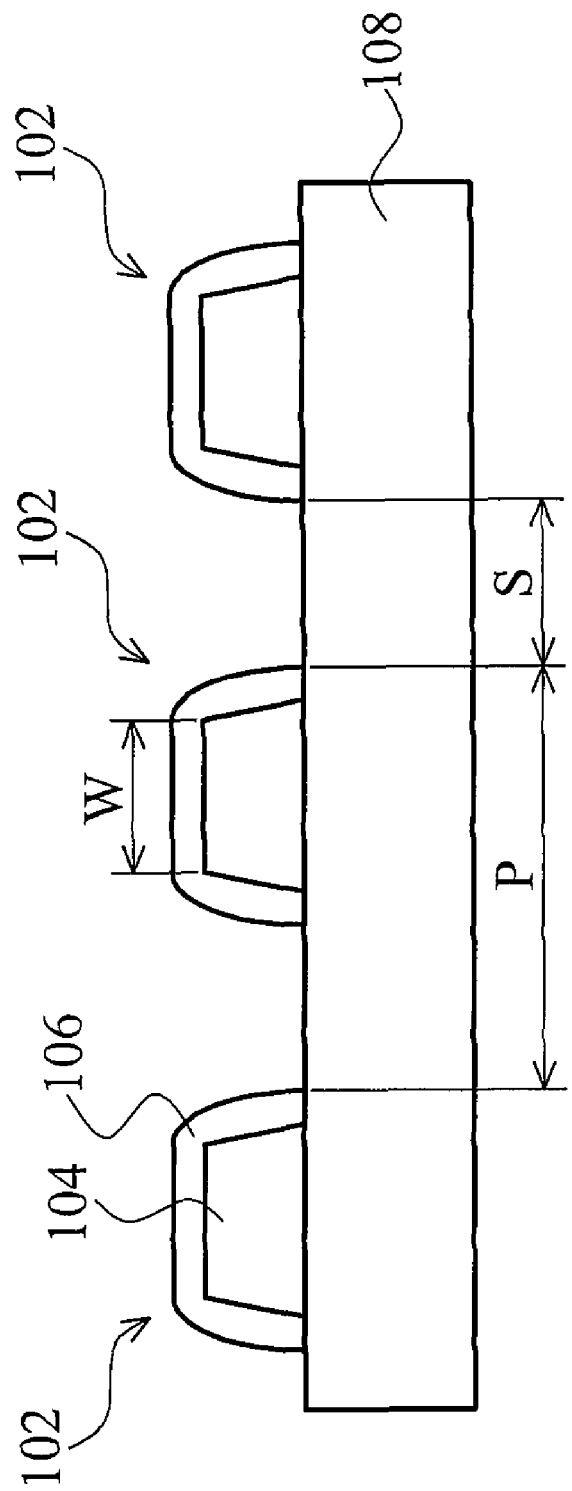
FIG. 1 shows a cross-section view of a conventional wire bonding substrate.
Figure 2:
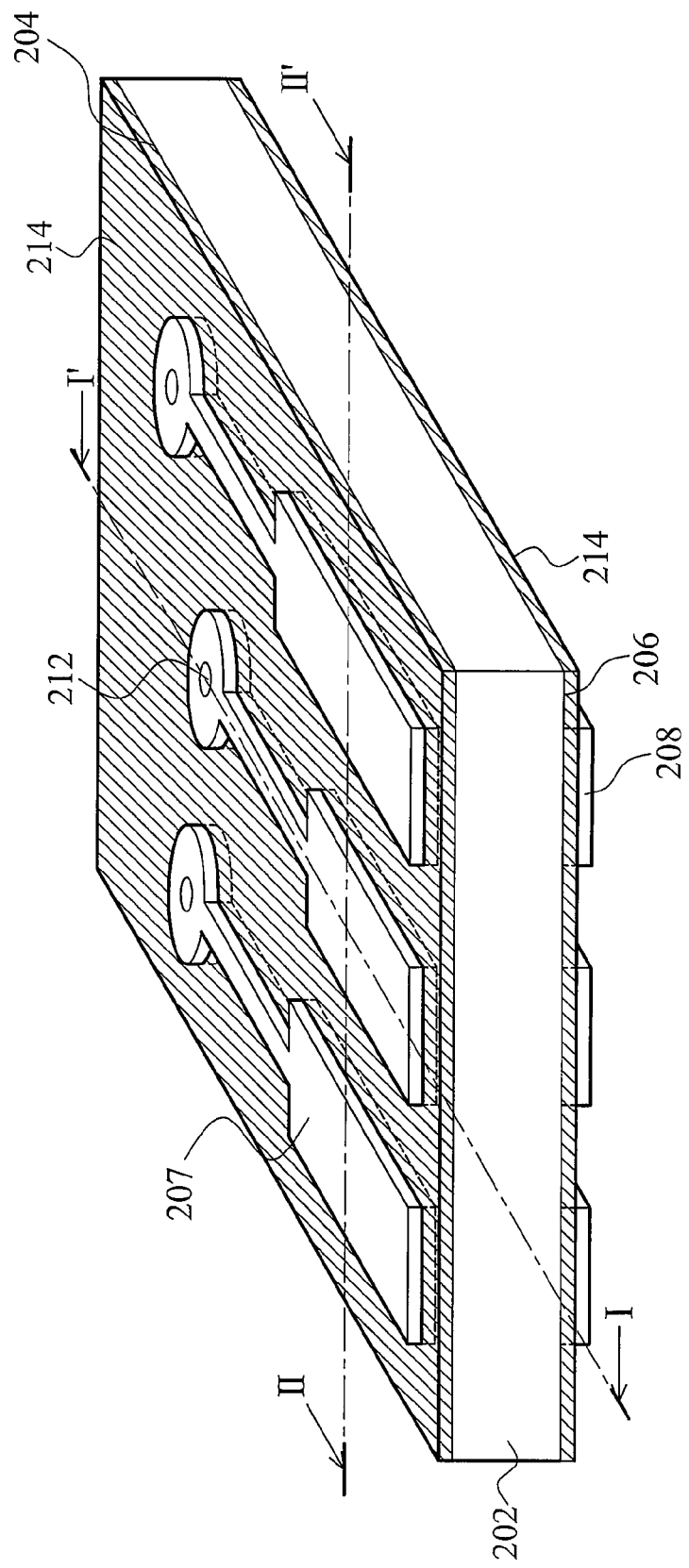
FIG. 2 shows a 3D view of a wire bonding substrate of an embodiment of the invention.

FIG. 2 shows a 3D view of a wire bonding substrate 202 of an embodiment of the invention. In FIG. 2, a plurality of bonding pads (also referred as gold fingers 207) are formed on a first surface 204 of the substrate 202, and a plurality of solder-ball pads 208 are formed on a second surface 206 of the substrate 202. The bottom portions of the gold fingers 207 and solder-ball pads 208 are embedded in the insulating layer 214, and a plurality of through holes 212 are formed in the substrate 202. Note that FIG. 2 is only a schematic figure, in which solder mask layers are omitted and the detail structures of the gold fingers 207 and solder-ball pads 208 should be referred to in the following described figures.

Figure 3B:
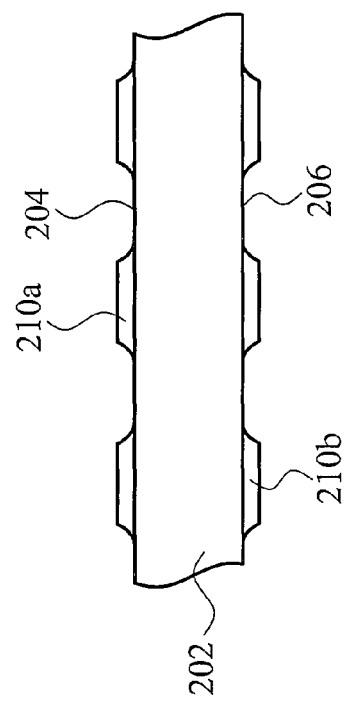
FIG. 3B shows a cross-section view of an intermediate process step of a wire bonding substrate of an embodiment of the invention along line II-II' of FIG. 2.
Figure 3A:
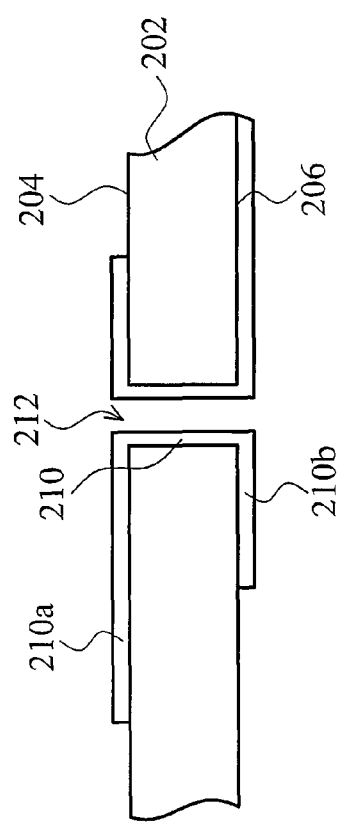
FIG. 3A shows a cross-section view of an intermediate process step of a wire bonding substrate of an embodiment of the invention along line I-I' of FIG. 2.

A method for forming a wire bonding substrate 202 of an embodiment of the invention is illustrated in accordance with FIG. 3A~FIG. 6B. First, referring to FIG. 3A and FIG. 3B, which FIG. 3A and FIG. 3B show cross-section views along line I-I' and II-II' of FIG. 2, respectively, a substrate 202 is provided and a plurality of through holes 212 are formed in the substrate 202 by a drilling process. For convenience, only one through hole is described in the following paragraph. Next, a conductive layer 210, such as copper, is deposited on the first surface 204 and the second surface 206 of the substrate 202, and covers the sidewall of the through hole 212. The conductive layer 210 is then patterned by a lithography and etching process to form first conductive pads 210a on the first surface 204 of the substrate 202 and form second conductive pads 210b on the second surface 206 of the substrate 202. Note that at least some of the first conductive pads 210a electrically connects the second conductive pads 210b through the conductive layer 210 on the sidewall of the through hole 212.

Figure 4B:
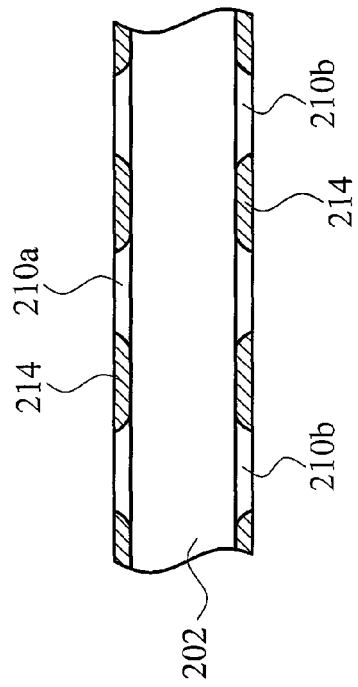
FIG. 4B shows a cross-section view of an intermediate process step of a wire bonding substrate of an embodiment of the invention along line II-II' of FIG. 2.
Figure 4A:
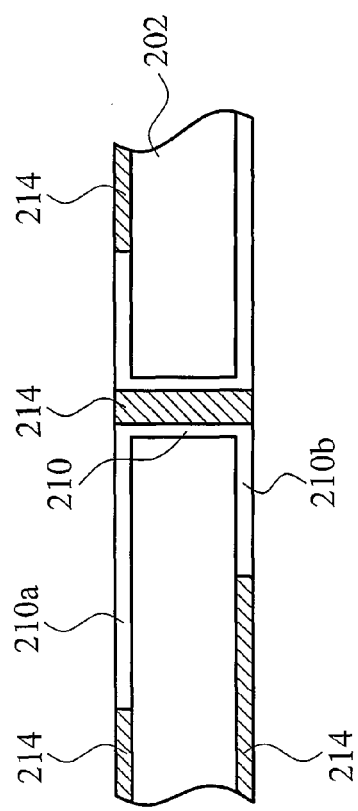
FIG. 4A shows a cross-section view of an intermediate process step of a wire bonding substrate of an embodiment of the invention along line I-I' of FIG. 2.

Referring to FIG. 4A and FIG. 4B, which FIG. 4A and FIG. 4B show cross-section views along line I-I' and II-II' of FIG. 2, respectively, an insulating layer 214 is respectively deposited on the first surface 204 and the second surface 206 of the substrate 202, wherein the insulating layer 214 completely fills the through hole 212 and covers the sidewalls of the first conductive pads 210a and the second conductive pads 210b. Specifically, the gap between the adjacent first conductive pads 210a and the gap between the adjacent second conductive pads 210b are filled with the insulating layer 214. Thereafter, the insulating layer 214 is recessed by an etching back, brushing or polishing process until top surfaces of the first conductive pads 210a and the second conductive pads 210b are exposed. In the embodiment, the insulating layer 214 can be organic or inorganic materials with insulating characteristic, such as resin, oxide or nitride.

Figure 5A:
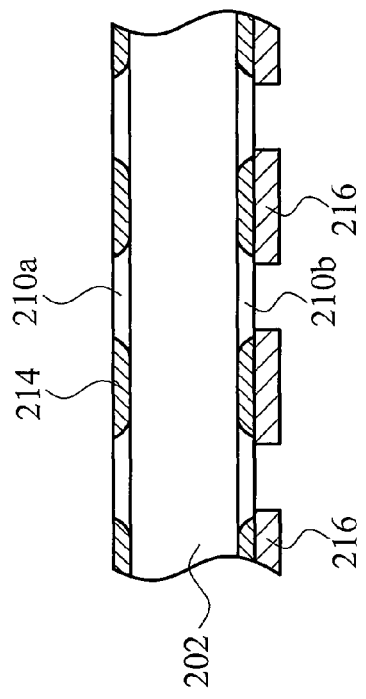
FIG. 5A shows a cross-section view of an intermediate process step of a wire bonding substrate of an embodiment of the invention along line I-I' of FIG. 2.
Figure 5B:
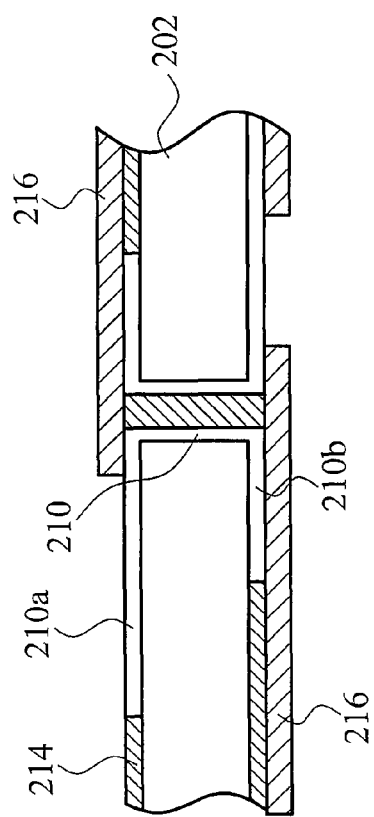
FIG. 5B shows a cross-section view of an intermediate process step of a wire bonding substrate of an embodiment of the invention along line II-II' of FIG. 2.

Referring to FIG. 5A and FIG. 5B, solder mask layers 216 are formed on the first surface 204 and the second surface 206 of the substrate 202 by, for example a screen printing process. The solder mask layers 216 expose some of the first conductive pads 210a and the second conductive pads 210b for wire bonding or electrical connection in subsequent steps.

Figure 6A:
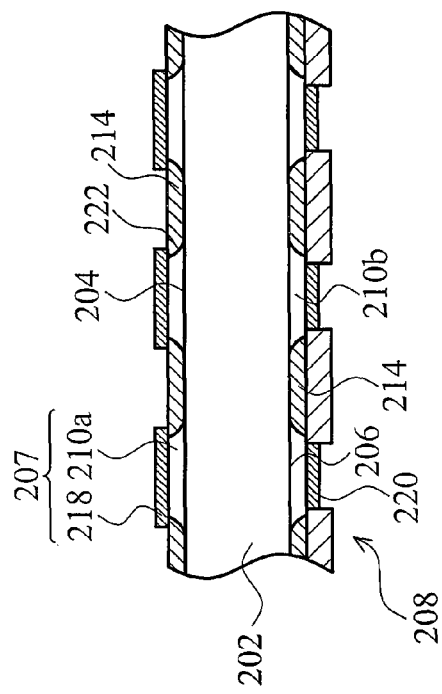
FIG. 6A shows a cross-section view of an intermediate process step of a wire bonding substrate of an embodiment of the invention along line I-I' of FIG. 2.
Figure 6B:
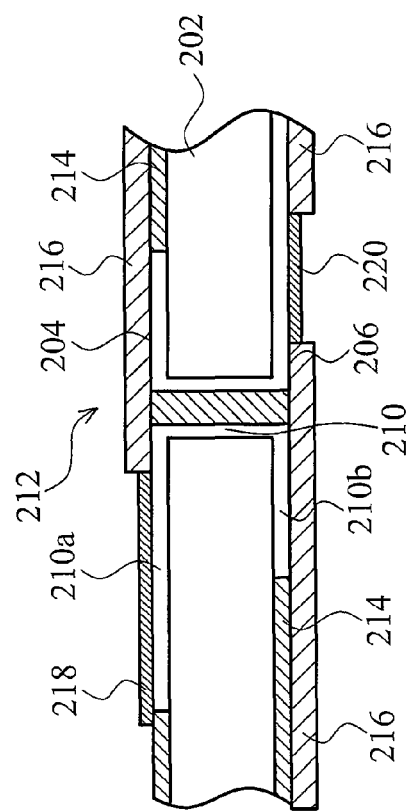
FIG. 6B shows a cross-section view of an intermediate process step of a wire bonding substrate of an embodiment of the invention along line II-II' of FIG. 2.

Referring to FIG. 6A and FIG. 6B, an electroplating process is performed to form a first metal layer 218, for example comprising nickel and gold, on the exposed first conductive pads 210a. Note that the embodiment uses a busless technique to electroplate the first metal layer 218 on the first conductive pads 210a by applying current from the second conductive pads 210b to the first conductive pads 210a through the conductive layer 210 passing the through hole 212. Due to the busless circuit design, extending bus lines for electroplating on the periphery of the substrate 202 are not required in the embodiment and wiring density can be increased. Further, the sidewalls 222 of the first conductive pads 210a are covered by the insulating layer 214, and conductive materials, such as metal, cannot be deposited thereon during electroplating. Therefore, the first metal layer 218 is only formed on the top surfaces of the first conductive pads 210a. In another embodiment, the first metal layer 218 slightly extends to cover a portion of the insulating layer 214. In the embodiment, the first conductive pads 210a covered with the first metal layer 218 are referred to as gold fingers 207 for wire bonding.

It is noted that the electroplating process is performed twice to electroplate nickel and gold layers on the first surface 204 and the second surface 206 of the substrate 202, respectively, in the embodiment. Referring to FIG. 6A and FIG. 6B again, the embodiment can further electroplate a second metal layer 220, such as nickel and gold, on the second conductive pads 210b by applying current from the first conductive pads 210a to the second conductive pads 210b through the conductive layer 210 passing the through hole 212.

Compared with the conventional method of electroplating nickel and gold for forming gold fingers 207, the method of the embodiment can effectively increase wire bonding top width and area. Since the bottom portions of the first conductive pads 210a of the gold fingers 207 are covered with insulating materials 214, conductive materials are not deposited thereon during the electroplating process. Therefore, issues of open or short for the gold fingers 207 do not easily occur, and product yield is accordingly increased. In another aspect, because the nickel and gold layer 218 is only formed on the top surfaces of the first conductive pads 210a, the bonding wire width can be increased and be kept at a sufficient distance between the bottom portions of adjacent gold fingers 207. Hence, migration issues due to small distances between bottom portions of adjacent gold fingers 207 can be eliminated. Alternatively, the nickel and gold layer 218 is deposited only on the top surfaces of the first conductive pads 210a in an embodiment of the invention, but conventional method deposits the nickel and gold layer 218 on both the top surfaces and the sidewalls of the conductive pads. Therefore, the embodiment can save usage of gold and nickel, which is costly, to reduce manufacturing costs of products.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for forming a wire bonding substrate, comprising:
   providing a substrate, comprising a first surface and a second surface;
   forming a through hole in the substrate;
   forming a conductive layer on the first surface and the second surface of the substrate and covering a sidewall of the through hole;
   patterning the conductive layer on the first surface of the substrate to form at least a first conductive pad, and patterning the conductive layer on the second surface of the substrate to form at least a second conductive pad;
   forming an insulating layer on the first surface and the second surface of the substrate and covering the first conductive pad and the second conductive pad;
   recessing the insulating layer until top surfaces of the first conductive pad and the second conductive pad are exposed; and
   electroplating a first metal layer on the first conductive pad by applying current from the second conductive pad to the first conductive pad through the conductive layer passing the through hole.

2. The method for forming a wire bonding substrate as claimed in claim 1, further comprising forming a solder mask layer on the first surface of the substrate before the step of electroplating the first metal layer, and the solder mask layer exposes the first conductive pad for the subsequent electroplating process.

3. The method for forming a wire bonding substrate as claimed in claim 1, further comprising forming a solder mask layer on the second surface of the substrate, and the solder mask layer exposes the second conductive pad for the subsequent electroplating process.

4. The method for forming a wire bonding substrate as claimed in claim 1, wherein the first metal layer comprises nickel and gold.

5. The method for forming a wire bonding substrate as claimed in claim 1, wherein the first conductive pad and the first metal layer constitute a gold finger for wire bonding.

6. The method for forming a wire bonding substrate as claimed in claim 1, further comprising electroplating a second metal layer on the second conductive pad by applying current from the first conductive pad to the second conductive pad through the conductive layer passing the through hole.

7. The method for forming a wire bonding substrate as claimed in claim 6, wherein the second metal layer comprises nickel and gold.

8. The method for forming a wire bonding substrate as claimed in claim 1, wherein the insulating layer comprises resin, oxide or nitride.

9. The method for forming a wire bonding substrate as claimed in claim 1, the step of recessing the insulating layer is performed by a brushing or polishing process.

10. The method for forming a wire bonding substrate as claimed in claim 1, the insulating layer is filled into the through hole.

* * * * *